(12) United States Patent
Liao et al.

(10) Patent No.: US 11,508,900 B2
(45) Date of Patent: Nov. 22, 2022

(54) HUMAN JOINT ENERGY HARVESTING APPARATUS AND WEARABLE ELECTRONIC DEVICE COMPRISING THE SAME

(71) Applicant: The Chinese University of Hong Kong, Hong Kong (CN)

(72) Inventors: Wei-Hsin Liao, Hong Kong (CN); Fei Gao, Neijiang (CN); Gao-Yu Liu, Guilin (CN); Brendon Lik-Hang Chung, Hong Kong (CN); Hugo Hung-Tin Chan, TKO (CN)

(73) Assignee: The Chinese University of Hong Kong, Hong Kong (CN)

( * ) Notice: Subject to any disclaimer, the term of this patent is extended or adjusted under 35 U.S.C. 154(b) by 513 days.

(21) Appl. No.: 16/696,109

(22) Filed: Nov. 26, 2019

(65) Prior Publication Data
US 2021/0159388 A1 May 27, 2021

(51) Int. Cl.
*H02N 2/18* (2006.01)
*H01L 41/113* (2006.01)
(Continued)

(52) U.S. Cl.
CPC ............ *H01L 41/1138* (2013.01); *F03G 5/06* (2013.01); *H01L 41/0805* (2013.01);
(Continued)

(58) Field of Classification Search
CPC ... H02N 2/18; H01L 41/1138; H01L 41/0805; H02K 7/1876; G03G 5/06
See application file for complete search history.

(56) References Cited

U.S. PATENT DOCUMENTS 6,281,594 B1 * 8/2001 Sarich ...................... A43B 3/34
290/1 R
6,768,246 B2 7/2004 Pelrine et al.
(Continued)

FOREIGN PATENT DOCUMENTS

CN 102769409 A 11/2012
CN 103036477 A 4/2013
(Continued)

*Primary Examiner* — J. San Martin
(74) *Attorney, Agent, or Firm* — Schwegman Lundberg & Woessner, P.A.

(57) ABSTRACT

The present application provides a human joint energy harvesting apparatus for capturing the biomechanical energy of a joint to generate electrical energy. The generated electrical energy may provide a real-time power supply to the wearable electronics. The apparatus employs a linear slide rail mechanism and cooperates with the user's first limb and second limb to form a slider-crank mechanism, which converts the rotating motion of the joint into a linear motion of the linear slide rail mechanism. The bending beam converts the linear motion of the linear slide rail mechanism into a bending motion. A piezoelectric film may be bonded to the upper and lower surfaces of the bending beam. During walking, the bending beam is deformed, causing the piezoelectric film to be stretched or compressed to generate electrical energy. To harvest more energy, the bending beam used in the apparatus is designed to be subjected to forced motion and free vibration, and a proof mass is attached to it. The present application also provides a wearable electronic device equipped with the human joint energy harvesting apparatus.

18 Claims, 11 Drawing Sheets

(51) Int. Cl.
*F03G 5/06* (2006.01)
*H01L 41/08* (2006.01)
*H02K 7/18* (2006.01)

(52) U.S. Cl.
CPC ........... *H02K 7/1876* (2013.01); *H02N 2/181* (2013.01); *H02N 2/186* (2013.01)

(56) References Cited

U.S. PATENT DOCUMENTS

| | | | |
|---|---|---|---|
| 6,982,497 | B2 | 1/2006 | Rome |
| 7,345,407 | B2 | 3/2008 | Tanner |
| 7,977,807 | B1 * | 7/2011 | Connor ................. F03G 7/08 290/1 R |
| 8,299,634 | B2 | 10/2012 | Donelan et al. |
| 8,354,778 | B2 | 1/2013 | Arnold et al. |
| 8,569,935 | B1 | 10/2013 | Kosierkiewicz |
| 8,723,398 | B2 | 5/2014 | Lee |
| 9,364,675 | B2 | 6/2016 | Deterre et al. |
| 9,647,579 | B2 | 5/2017 | Lee |
| 10,215,164 | B2 | 2/2019 | Dabby et al. |
| 10,291,099 | B1 * | 5/2019 | Huglen ................ H02K 7/1853 |
| 10,795,444 | B2 * | 10/2020 | Yu ...................... A63B 24/0087 |
| 11,171,544 | B2 * | 11/2021 | Chen ..................... H02K 7/1125 |
| 2006/0046907 | A1 * | 3/2006 | Rastegar ........... A63B 21/0552 482/148 |
| 2006/0046909 | A1 * | 3/2006 | Rastegar .................. F03G 5/06 482/148 |
| 2006/0046910 | A1 * | 3/2006 | Rastegar ................ A63B 23/04 482/148 |
| 2010/0084947 | A1 | 4/2010 | Yoon et al. |
| 2015/0035409 | A1 | 2/2015 | Procopio et al. |
| 2015/0272263 | A1 | 10/2015 | Szent-miklosy |
| 2015/0313519 | A1 | 11/2015 | Mckenna |
| 2015/0358737 | A1 | 12/2015 | Yang et al. |
| 2016/0156287 | A1 | 6/2016 | Yang et al. |
| 2016/0197261 | A1 | 7/2016 | Abdelkefi et al. |
| 2017/0208890 | A1 | 7/2017 | Torvinen et al. |
| 2021/0048007 | A1 * | 2/2021 | Mullins ..................... F03G 7/08 |

FOREIGN PATENT DOCUMENTS

| | | |
|---|---|---|
| CN | 103872946 A | 6/2014 |
| CN | 104362721 A | 2/2015 |
| CN | 102868319 B | 3/2016 |
| CN | 103684046 B | 3/2016 |
| CN | 105533878 A | 5/2016 |
| CN | 105743388 A | 7/2016 |
| CN | 105952595 A | 9/2016 |
| CN | 205597245 U | 9/2016 |
| CN | 106050570 A | 10/2016 |
| CN | 104485850 B | 1/2017 |
| CN | 106374777 A | 2/2017 |
| CN | 106849596 A | 6/2017 |
| CN | 206237334 U | 6/2017 |
| CN | 105167308 B | 12/2017 |
| CN | 107528497 A | 12/2017 |
| CN | 207074963 U | 3/2018 |
| CN | 108134538 A | 6/2018 |
| CN | 108540014 A | 9/2018 |
| CN | 109672363 A | 4/2019 |
| EP | 3235395 A1 | 10/2017 |
| WO | WO-2010151738 A2 | 12/2010 |
| WO | WO-2013062406 A1 | 5/2013 |
| WO | WO-2014116794 A1 | 7/2014 |
| WO | WO-2017027816 A1 | 2/2017 |
| WO | WO-2017048906 A1 | 3/2017 |

* cited by examiner

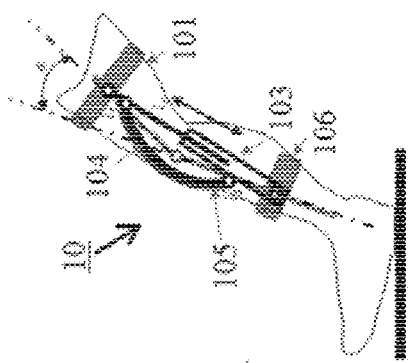
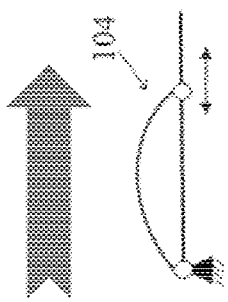
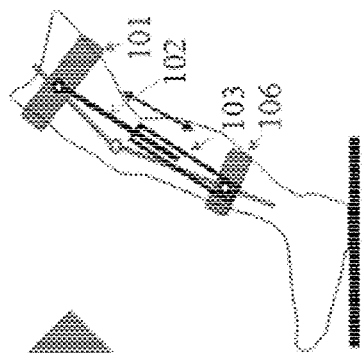
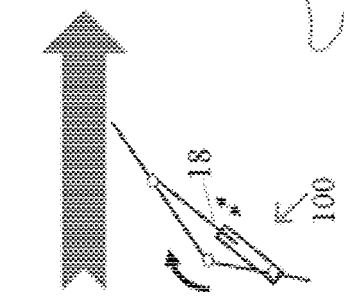
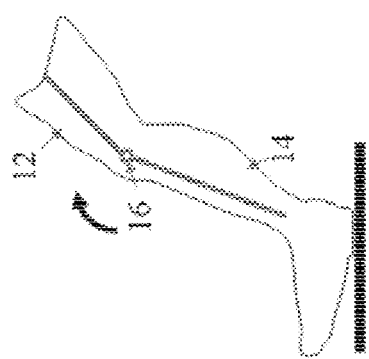

HUMAN JOINT ENERGY HARVESTING APPARATUS AND WEARABLE ELECTRONIC DEVICE COMPRISING THE SAME

TECHNICAL FIELD

The present disclosure relates to a human joint energy harvesting apparatus, and in particular to a piezoelectric materials-based human joint energy harvesting apparatus. The present disclosure further relates to a wearable electronic device equipped with the human joint energy harvesting apparatus.

BACKGROUND

Nowadays, with further progress in electronics and communications technology, various wearable and portable electronic devices are developed for improving the people's life quality, such as, smartphone, smart band, electronic watch, and blood pressure monitor. These types of wearable devices may be connected and communicated wirelessly and may be used in various fields of life to make our life more convenient and increase our living standard. However, the limited battery life significantly blocks the widespread use of these devices. Further, the frequent charging of the portable electronic devices considerably decreases the user experience.

To solve the above issue, researchers have proposed to develop self-powered wearable electronic devices. In particular, the self-powered device may get power supply from environment or users' bodies in real-time with an energy harvesting technology. Human motion may produce a large amount of biomechanical energy, heat energy, chemical energy, electrostatic energy and the like. For example, when walking, the peak power of human knee and hip joints can reach about 70 W, and for a human ankle joint, the peak power may be 300 W, or even larger. The human biomechanical energy may be converted to electrical energy by an energy converting apparatus, so as to assist in solving the issue of limited battery life of the portable electronic device. In addition, the self-powered wearable electronic devices may reduce the usage of the battery and thus relief the environmental pollution from the waste battery.

Compared with the ankle joint and the hip joint, the knee joint has a larger range of motion. In addition, the primary motion of the human knee joint occurs in a sagittal plane, which simplifies the capture of kinetic energy by energy harvesting apparatus. In consideration of the above advantages, many researchers have been dedicated to the research of harvesting the energy produced by the knee joint motion. For example, an existing patent application proposes to capture biomechanical energy from the motion of the human knee using an electromagnetic harvesting apparatus. During walking, the motion of the knee joint may drive the power generation unit to rotate and thus harvest the energy produced by the motion of the knee joint. To improve energy harvesting efficiency, a gear chain with a large transmission ratio was used to boost the velocity of the electromagnetic generator so as to increase the induced electromotive force. However, due to the use of a gearbox, this energy harvesting apparatus is bulky. It is inconvenient for the users to wear and take off this device. Additionally, large extra effort is required for carrying this device, which causes the users to make more effort for walking. The above defects impede the development and usage of the electromagnetic harvesting apparatus.

SUMMARY

The present disclosure proposes a piezoelectric smart material-based human joint energy harvesting apparatus.

The apparatus proposed in one embodiment of the present application is capable of capturing large range of motion of joints (e.g., knee joints, elbow joints, ankle joints, etc.) and converting the biomechanical energy produced by human motion into electrical energy through a flexible piezoelectric material so as to provide real-time energy supply for micro-power portable wearable electronics.

According to an aspect of the present disclosure, a human joint energy harvesting apparatus is provided. The human joint energy harvesting apparatus may comprise: a first fixing band attached to a user's first limb connected with a joint of the user; a second fixing band attached to the user's second limb connected with the joint; a motion conversion unit connected between the first fixing band and the second fixing band for converting a rotating motion of the joint into a linear motion; a bending beam connected to the motion conversion unit, wherein the linear motion of the motion conversion unit is converted into a bending motion of the bending beam; and an energy conversion unit mounted on an upper surface or/and a lower surface of the bending beam. The energy conversion unit is deformable to produce deformation in response to the bending motion and converts the deformation into electrical energy.

According to an exemplary embodiment of the present application, the motion conversion unit may comprise a slide rail mechanism including a linear guide rail and a slider. The linear guide rail is connected to the first fixing band, and the slider is connected to the second fixing band. The slide rail mechanism may work with the first limb and the second limb to operate as a slider-crank mechanism, to convert the rotating motion of the joint into a linear sliding of the slider on the linear guide rail. One end of the bending beam is connected to the slider and the other end of the bending beam is connected to the linear guide rail.

According to an exemplary embodiment of the present application, the human joint energy harvesting apparatus may further comprise a first adaptor fixed on the first fixing band; a second adaptor fixed on the second fixing band; a first rotating shaft mounted on the first adaptor, wherein the first adaptor is configured to adjust a direction of the first rotating shaft; a second rotating shaft mounted on the second adaptor, wherein the second adaptor is configured to adjust a direction of the second rotating shaft. One end of the bending beam may be connected to the first rotating shaft. The motion conversion unit may comprise: a slider stopper with one end connected to the other end of the bending beam; a linear guide rail connected to the other end of the slider stopper; and a slider mounted on the linear guide rail and rotating around the second rotating shaft.

To ensure the first fixing band and the second fixing band to be stably mounted on corresponding parts of the human body, the contact surface of the first fixing band and the second fixing band may be designed and processed according to the corresponding limb shape of the user.

According to an exemplary embodiment of the present application, the human joint energy harvesting apparatus may further comprise a proof mass fixed to the bending beam.

According to an exemplary embodiment of the present application, the energy conversion unit may comprise a piezoelectric film. For example, the piezoelectric film may be made of piezoelectric smart materials or the like.

The piezoelectric film is bonded to the upper and lower surfaces of the bending beam. When the curved beam is subjected to bending deformation, the piezoelectric film may sustain stretching or compressing deformation to generate electrical energy.

The upper and lower piezoelectric films bonded to the bending beam are subjected to opposite deformations. When piezoelectric films are configured in parallel, the positive electrode of piezoelectric films bonded to the upper side of bending beam should be connected to the negative electrode of piezoelectric films bonded to the lower side of bending beam, and vice versa. However, if piezoelectric films are configured in series, the positive electrode of piezoelectric films bonded to the upper side of bending beam should be connected to the positive electrode of piezoelectric films bonded to the lower side of bending beam, and vice versa.

According to an exemplary embodiment of the present application, the first fixing band and the second fixing band may be parts of the user's garment.

According to an exemplary embodiment of the present application, the bending beam may be configured to be a flexible beam able to sustain larger deformation, such as an elastic beam made of carbon fiber.

According to an exemplary embodiment of the present application, the piezoelectric film may be a flexible piezoelectric film or a stretchable piezoelectric film. For example, the piezoelectric film may be made of piezoelectric macro fiber composites.

According to an exemplary embodiment of the present application, the energy conversion unit may be configured to a triboelectric transducer for converting mechanical energy into electrical energy.

According to an exemplary embodiment of the present application, the joint may comprise for example one of a knee joint, an ankle joint and an elbow joint.

According to an exemplary embodiment of the present application, the energy conversion unit may be deformed to produce deformation in response to the bending beam being bent when the joint performs a flexion motion, and converts the deformation into electrical energy According to an exemplary embodiment of the present application, the slider may be fixedly connected to the slider stopper. In this case, the bending beam is subjected to a forced motion during a whole gait cycle when the user walks According to an exemplary embodiment of the present application, the slider may freely contact with the slider stopper and move along the guide rail. In this case, the bending beam is subjected to a forced motion and a free vibration during a gait cycle when the user walks.

According to an exemplary embodiment of the present application, when the bending beam is subjected to a forced motion and a free vibration, the proof mass may be configured to adjust the free vibration to improve energy harvesting efficiency.

According to another aspect of the present disclosure, a wearable electronic device comprising an energy supply unit is provided. When the wearable electronic device is worn by a user, the energy supply unit may be electrically connected to the human joint energy harvesting apparatus described above, so as to supply energy produced by the human joint energy harvesting apparatus to the wearable electronic device.

According to further another aspect of the present disclosure, a method for harvesting human energy is provided. The method may comprise: attaching a first fixing band to a user's first limb connected with a joint of the user; attaching a second fixing band to the user's second limb connected with the joint; converting a rotating motion of the joint into a linear motion by a motion conversion unit connected between the first fixing band and the second fixing band; converting the linear motion of the motion conversion unit into a bending motion of a bending beam with the bending beam connected to the motion conversion unit; and deforming an energy conversion unit mounted on an upper surface and/or a lower surface of the bending beam to produce deformation in response to the bending motion, and converting the deformation into electrical energy by the energy conversion unit.

According to an exemplary embodiment of the present application, the above motion conversion unit may comprise a slide rail mechanism including a linear guide rail and a slider. The linear guide rail is connected to the first fixing band, and the slider is connected to the second fixing band. The slide rail mechanism works with the first limb and the second limb to operate as a slider-crank mechanism. The step of converting the rotating motion into the linear motion may comprise converting the rotating motion of the joint into a linear sliding of the slider on the linear guide rail.

According to an exemplary embodiment of the present application, one end of the bending beam is connected to the slider and the other end of the bending beam is connected to the linear guide rail. The step of converting the deformation into electrical energy comprises: driving the slider to move along the linear guide rail by a flexion motion of the joint so as to force the bending beam to be deformed; and converting the deformation of the bending beam into the electrical energy.

According to an exemplary embodiment of the present application, the method may further comprise fixing a first adaptor on the first fixing band; fixing a second adaptor on the second fixing band; mounting a first rotating shaft on the first adaptor, and adjusting the direction of the first rotating shaft by the first adaptor; mounting a second rotating shaft on the second adaptor, and adjusting the direction of the second rotating shaft by the second adaptor; connecting one end of the bending beam to the first rotating shaft, and forcing the bending beam to be deformed with the linear motion of the motion conversion unit and converting the energy produced by the deformation of the bending motion into electrical energy.

According to an exemplary embodiment of the present application, the motion conversion unit may comprise: a slider stopper with one end connected to the other end of the bending beam; a linear guide rail connected to the other end of the slider stopper; and a slider mounted on the linear guide rail and rotating around the second rotating shaft. The step of converting energy produced by the bending motion into electrical energy comprises: driving the slider to move along the linear guide rail by a flexion motion of the joint so as to force the bending beam to be deformed; and converting the deformation of the bending beam into the electrical energy.

BRIEF DESCRIPTION OF THE DRAWINGS

The principles of the inventive concept are illustrated below by describing non-limiting embodiments of the present disclosure in conjunction with the accompanying drawings. It should be understood that the drawings are intended to illustrate, rather than limit the exemplary embodiments of the present disclosure. The accompanying drawings are included to provide a further understanding of the general concept of the present disclosure, and are incorporated in the specification to constitute a part thereof. The same reference numerals in the drawings denote the same features. In the accompanying drawings:

FIGS. 1A-1E are schematic diagrams showing the working principle of the human joint energy harvesting apparatus according to a first embodiment of the present disclosure.

DETAILED DESCRIPTION OF EMBODIMENTS

Figure 2:
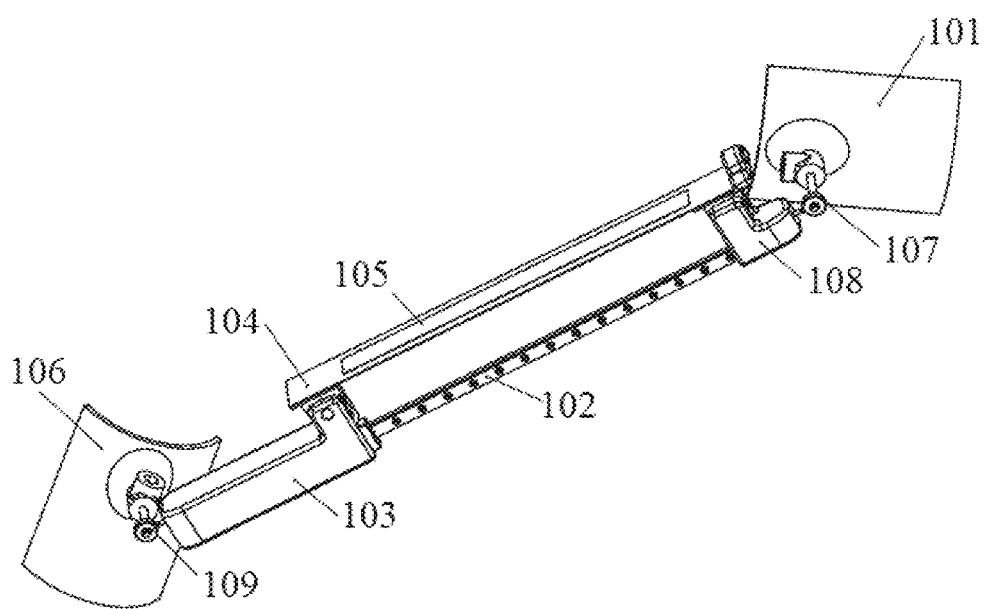
FIG. 2 is a schematic diagram showing the structure of the human joint energy harvesting apparatus according to the first embodiment of the present disclosure.

For a better understanding of the present disclosure, various aspects of the present disclosure will be described in more detail with reference to the exemplary embodiments illustrated in the accompanying drawings. It should be understood that the detailed description is merely an illustration of the exemplary embodiments of the present disclosure rather than a limitation to the scope of the present disclosure in any way.

The terminology used herein is for the purpose of describing particular exemplary embodiments and is not intended to limit the scope of the solution. It should be understood that the terms "comprising", "including", "having" and variants thereof, when used in the specification, specify the presence of stated features, elements, components and/or steps, but do not exclude the presence or addition of one or more other features, elements, components, steps and/or combinations thereof.

In addition, the expressions "connected with" and "connected to" may indicate that the relevant components are directly connected, or other components may be inserted between the related components.

It should be noted that in the description and the claims, the expressions, such as "first" and "second" are only used to distinguish one feature from another, rather than represent any limitations to the features. Thus, the first fixing band, the first adaptor discussed herein may also be referred to as the second fixing band, the second adaptor, and vice versa, without departing from the teachings of the present disclosure.

In the accompanying drawings, the thicknesses, sizes and shapes of the components have been slightly exaggerated for the convenience of explanation. The accompanying drawings are merely illustrative and not strictly drawn to scale.

The schematic diagrams of exemplary embodiments are referenced to describe the technical solution of the present disclosure. The exemplary embodiments disclosed herein are not to be construed as being limited to the particular shapes and dimensions shown in the Figs., instead, various equivalent structures that are capable of performing the same function, and variations in the shapes and dimensions resulting from, for example, manufacturing are also included in the scope of the present disclosure. The positions shown in the Figs. are schematic and are not intended to limit the specific location of the various components.

Unless otherwise defined, all terms (including technical and scientific terms) used herein have the same meaning as commonly understood by those skilled in the art to which the present disclosure belongs. It should be further understood that terms, such as those defined in commonly used dictionaries, should be interpreted as having a meaning that is consistent with their meaning in the context of the relevant art and will not be interpreted in an idealized or overly formal sense unless explicitly so defined herein.

The various aspects of the present disclosure are described in more detail below with reference to the accompanying drawings.

FIGS. 1A-1E are schematic diagrams showing the working principle of the human joint energy harvesting apparatus according to a first embodiment of the present disclosure; and FIG. 2 is a schematic diagram showing the structure of the human joint energy harvesting apparatus according to the first embodiment of the present disclosure.

As shown in FIGS. 1C and 1E, the human joint energy harvesting apparatus 10 may comprise a thigh fixing band 101 fixed to a user's thigh 12 and a shank fixing band 106 fixed to the user's shank 14. The thigh fixing band 101 and the shank fixing band 106 may be provided, for example, as part of the user's garment. Further, the thigh fixing band 101 and the shank fixing band 106 may also be provided as wearable members that may be worn on the thighs and shanks of the user.

The human joint energy harvesting apparatus 10 may further comprise a motion conversion mechanism 100 that converts the rotational motion of the knee joint 16 into a linear motion. The motion conversion mechanism 100 is disposed between the thigh fixing band 101 and the shank fixing band 106 and is hinged with the thigh fixing band 101 and the shank fixing band 106 to convert the rotational motion of the joint into a linear motion. For example, the motion conversion mechanism 100 may be implemented as the slider-crank mechanism shown in FIG. 1B. For example, a linear slide mechanism 18 may work with the user's thigh 12, lower leg 14, and knee joint 16 to operate as a slider-crank mechanism so as to convert the rotational motion of the user's knee joint 16 into a linear motion of the linear slide mechanism 18.

The linear slide mechanism 18 may comprise a slider 103, a linear guide rail 102, and a guide rail connector 108. The slider 103 is capable of sliding along the guide rail 102 but cannot rotate around it. The slider 103 may be hinged to the shank fixing band 106, for example, by a ball hinge 109, such that the slider 103 is rotatable relative to the shank fixing band 106. As shown in FIG. 2, the linear guide rail 102 is fixedly connected to the guide rail connector 108. The guide rail connector 108 is hinged to the thigh fixing band 101 by a ball hinge 107 such that the linear guide rail 102 is rotatable relative to the thigh fixing band 101.

As an example, when the user's knee joint performs a flexion motion, the slider 103 may slide along the linear guide rail 102 toward the guide rail connector 108, thereby a bending beam 104 connected between the slider 103 and the linear guide rail 102 is pressed to be deformed. The energy generated by the deformation of the bending beam 104 may then be converted to electrical energy by any suitable component.

As shown in FIG. 1D, the human joint energy harvesting apparatus 10 may convert the linear motion of the slider 103 into a bending motion of the bending beam 104. One end of the bending beam 104 is hinged to the slider 103 and the other end of the bending beam 104 is hinged to the guide rail connector 108. The bending beam 104 may be an elastic beam capable of sustaining large deformation, such as carbon fiber beams or the like.

As described above, the existing electromagnetic-based human body power generation apparatus is relatively bulky and cumbersome, and there is a large interaction force between the apparatus and the user, which significantly increases the user's walking burden and thus reduces the user's wearing experience.

In order to reduce the weight and volume of the apparatus to reduce the impact on the user's motion, a lightweight smart material-based energy harvesting apparatus has been proposed. This energy harvesting apparatus is dedicated to providing real-time energy supply to currently widely used micro-power portable electronic products, such as smart wristband, smart watches and the like. This smart material-based energy harvesting apparatus is simple in construction and does not require the use of bulky speed-increasing gearboxes. In addition, it may reduce the running noise of the apparatus and improve the user's experience. The smart material-based energy harvesting apparatus may comprise a thermoelectric harvesting apparatus, a friction power harvesting apparatus, and a piezoelectric energy harvesting apparatus. Piezoelectric energy harvesting apparatus has the characteristics of simple structure, easy miniaturization and convenient installation, and has been extensively studied in recent years.

When the piezoelectric material is subjected to external pressure or tension, the internal charge of the piezoelectric material moves in a particular direction, and a voltage difference is formed between two ends of the piezoelectric material. The piezoelectric materials may convert the mechanical energy into electrical energy with the piezoelectric properties described above.

In recent years, with the development of smart materials, flexible piezoelectric materials such as polyvinyl fluoride piezoelectric film (PVDF), piezoelectric macro fiber composite (MFC) and the like have been proposed. Such flexible piezoelectric materials may sustain larger mechanical deformation and thus more power may be obtained. For example, Chinese Patent Application No. 201810457579.2 proposes a low frequency flexible energy harvester in which a flexible piezoelectric film attached to a flexible cantilever beam may be used to convert limb motion into high frequency resonant power generation.

Because it is easy for the flexible smart material to be bent, deformed by stretching and compressing, and coupled with large deformation mechanical motion, mechanical energy may be directly and efficiently converted into electrical energy. Therefore, it has great development potential and commercial application prospect in the field of human motion energy harvesting.

In an exemplary embodiment of the present application, an energy conversion device such as a piezoelectric film 105 may be disposed on an upper surface and/or a lower surface of the bending beam 104. When the bending beam 104 is bent and deformed, the piezoelectric film 105 may be stretched or compressed to convert the energy generated by the deformation into electrical energy. The piezoelectric film 105 may be a flexible piezoelectric film or a stretchable piezoelectric film such as a piezoelectric fiber composite or the like.

The piezoelectric films 105 on the upper and lower surfaces of the curved beam 104 are subjected to the opposite deformation. When the piezoelectric films 105 are configured in parallel, the positive electrode of piezoelectric films 105 bonded to the upper surface of bending beam 104 should be connected to the negative electrode of piezoelectric films 105 bonded to the lower surface of bending beam 104, and vice versa.

Figure 3:
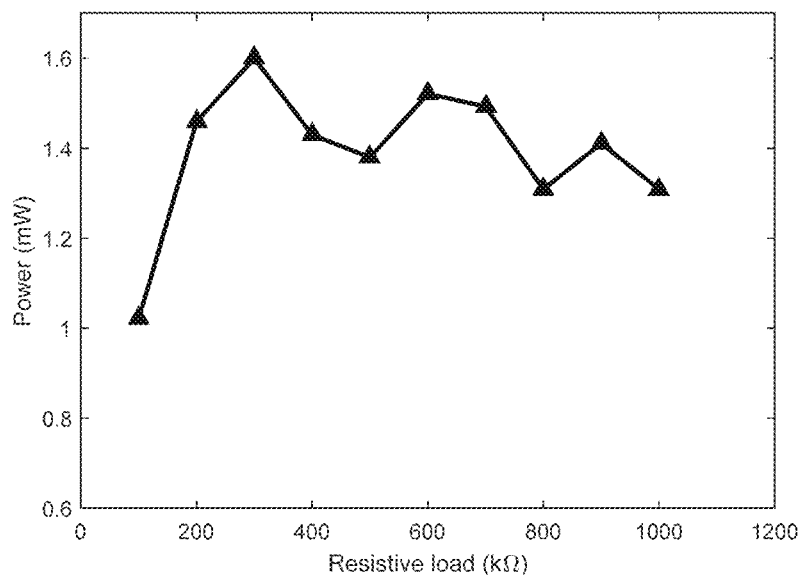
FIG. 3 shows the output power of the human joint energy harvesting apparatus under different load resistance according to the first embodiment of the present disclosure.

FIG. 3 shows the output power of the human joint energy harvesting apparatus under different load resistance according to the first embodiment of the present disclosure. In the test of FIG. 3, the user walks on a treadmill at a speed of 4 km/h, and the load resistance of the harvesting apparatus is set at a series of values during the test. It should be noted that in the test, the piezoelectric film 105 is only bonded to the upper surface of the curved beam. The piezoelectric film 105 has a thickness of 0.3 mm, a width of 14 mm, and a length of 200 mm. However, it should be understood that the piezoelectric film may be bonded only to the lower surface of the bending beam or to the upper surface and the lower surface of the bending beam. Further, the size of the piezoelectric film used in the test is merely an example, and the piezoelectric film may be set to other suitable sizes and shapes as needed.

Figure 4:
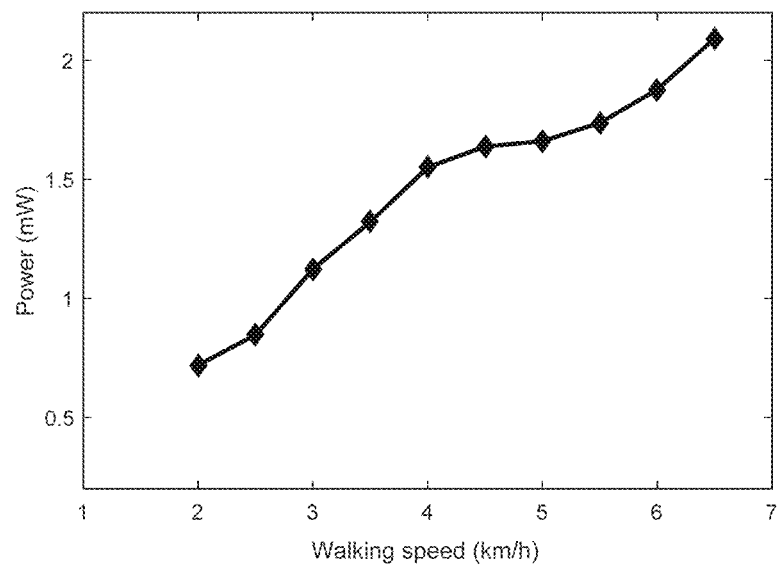
FIG. 4 shows the output power of the human joint energy harvesting apparatus under different walking speed according to the first embodiment of the present disclosure.

FIG. 4 shows the output power of the human joint energy harvesting apparatus under different walking speed according to the first embodiment of the present disclosure. In the test, the user walks on the treadmill and the load resistance is set to 300 kΩ. The walking speed is set at a series of values. It should be noted that in the test, the piezoelectric film 105 is only bonded to the upper surface of the curved beam. The piezoelectric film has a thickness of 0.3 mm, a width of 14 mm and a length of 200 mm. However, it should be understood that the piezoelectric film may be only bonded to the lower surface of the bending beam or to the upper surface and the lower surface of the bending beam. Further, the size of the piezoelectric film used in the test is merely an example, and the piezoelectric film may be set to other suitable sizes and shapes as needed.

Figure 5:
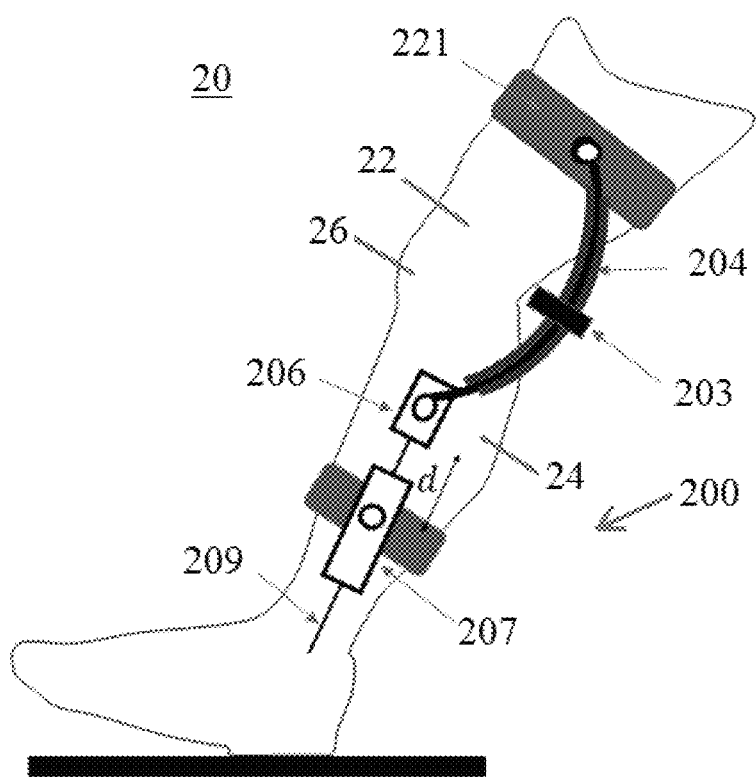
FIG. 5 is a schematic diagram showing the working principle of the human joint energy harvesting apparatus according to a second embodiment of the present disclosure.
Figure 6:
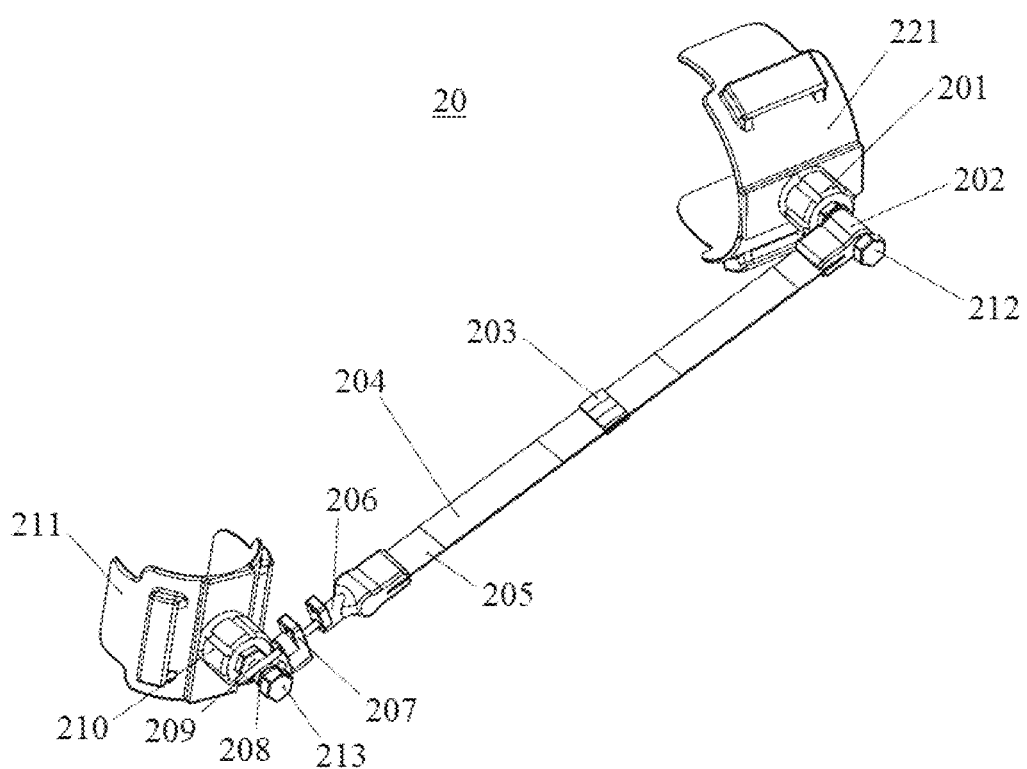
FIG. 6 is a schematic diagram showing the structure of the human joint energy harvesting apparatus according to the second embodiment of the present disclosure.

FIG. 5 is a schematic diagram showing the working principle of the human joint energy harvesting apparatus according to a second embodiment of the present disclosure, and FIG. 6 is a schematic diagram showing the structure of the human joint energy harvesting apparatus according to the second embodiment of the present disclosure. As shown in FIG. 5, the human joint energy harvesting apparatus 20 may include a thigh fixing band 221 that is fixed to the user's thigh 22 and a shank fixing band 211 that is fixed to the user's shank 24.

The human joint energy harvesting apparatus 20 may further comprises a thigh adaptor 201 mounted on the thigh fixing band 221 and a shank adaptor 210 mounted on the shank fixing band 211. The thigh rotating shaft 212 is fixed to the thigh adaptor 201. The thigh adaptor 201 may be configured to change the orientation of the thigh rotating shaft 212 to adjust the comfort of the thigh fixing band 221 on the thigh. The shank rotating shaft 213 is fixed to the shank adaptor 210. The shank adaptor 210 may be configured to change the orientation of the shank rotating shaft 213 to adjust the comfort of the shank fixing band 211 on shank.

The human joint energy harvesting apparatus 20 may also comprises a motion conversion mechanism 200. The motion conversion mechanism 200 is disposed between the thigh fixing band 221 and the shank fixing band 211 and is connected to the thigh fixing band 221 and the shank fixing band 211 to convert the rotational motion of the knee joint into a linear motion.

Further, a bending beam 205 may be connected to the motion conversion mechanism 200. For example, the bending beam 205 may be disposed between the thigh fixing band 221 and the shank fixing band 211 together with the motion conversion mechanism 200. One end of the bending beam 205 may be fixed to a bending beam connector 202, and the other end of the bending beam 205 may be fixed to the motion conversion mechanism 200. The bending beam 205 may be configured to be parallel to the user's sagittal plane by adjusting the orientation of the thigh rotating shaft 212 and the shank rotating shaft 213.

In an exemplary embodiment, the motion conversion mechanism 200 may comprises a slider stopper 206, a linear guide rail 209, and a slider 207. The slider stopper 206 is fixed to the linear guide rail 209. The other end of the bending beam 205 is coupled to the slider stopper 206 of the motion conversion mechanism 200. The linear guide rail 209 may be coupled to the other end of the slider stopper 206. The slider 207 may be coupled to the shank fixing band 211 via a ball joint 208 and move along the linear guide rail 209.

The bending beam connector 202 is rotatable about the thigh rotating shaft 212. The bending beam 205 may be, for example, an elastic beam capable of sustaining larger deformation, such as a carbon fiber beam or the like. An energy conversion unit such as the piezoelectric film 204 is disposed on the upper surface and/or the lower surface of the bending beam 205. The bending beam may convert the linear motion of the motion conversion unit into a bending motion as the user walks. The piezoelectric film 204 is deformed in response to a bending motion and converts energy generated by the deformation into electrical energy.

When the piezoelectric films 204 are configured in parallel, the positive electrode of piezoelectric films 204 bonded to the upper surface of bending beam 205 should be connected to the negative electrode of piezoelectric films 204 bonded to the lower surface of bending beam 205, and vice versa.

A proof mass 203 may be fixed to the bending beam 205.

Figure 7A:
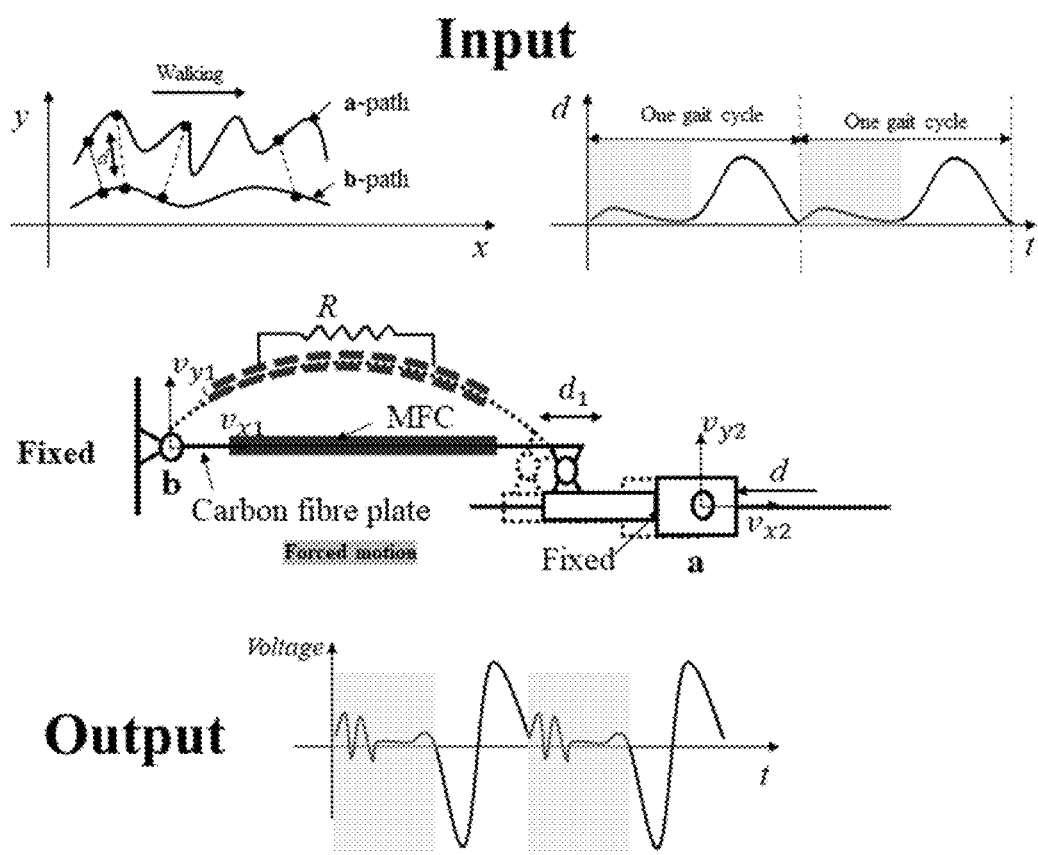
FIGS. 7A-7C each shows the working principle of the human joint energy harvesting apparatus under different mounting state according to the second embodiment of the present disclosure.
Figure 7B:
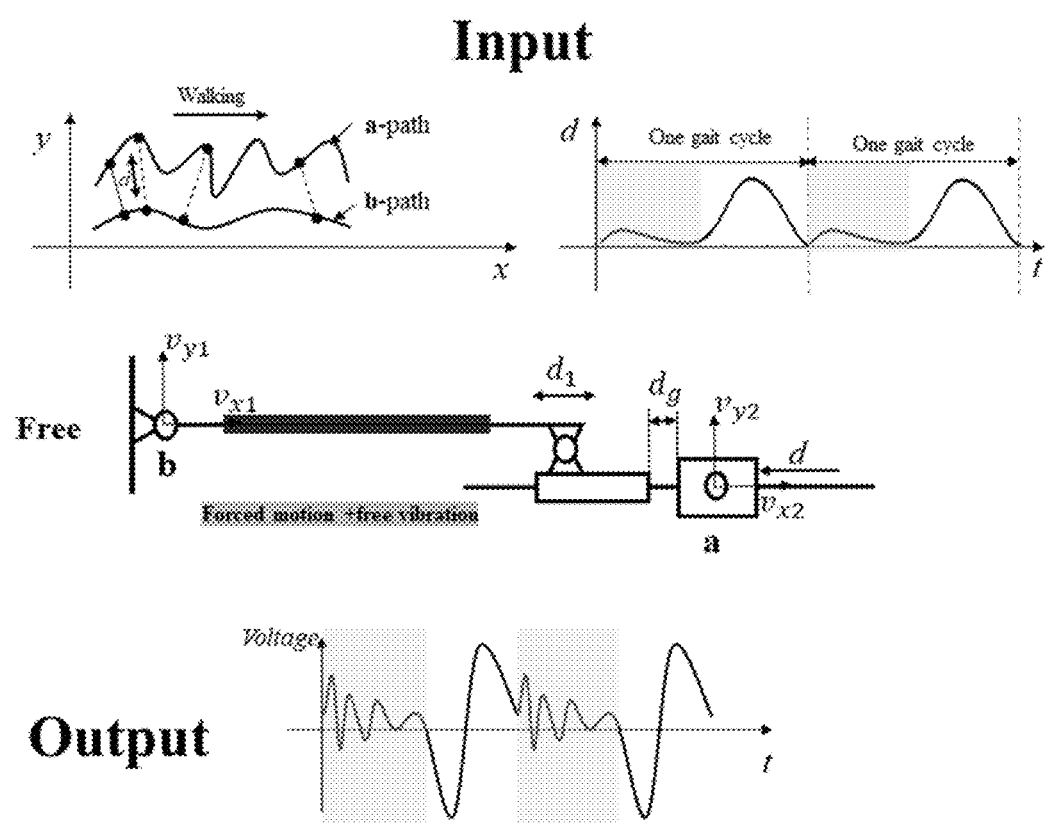
Figure 7C:
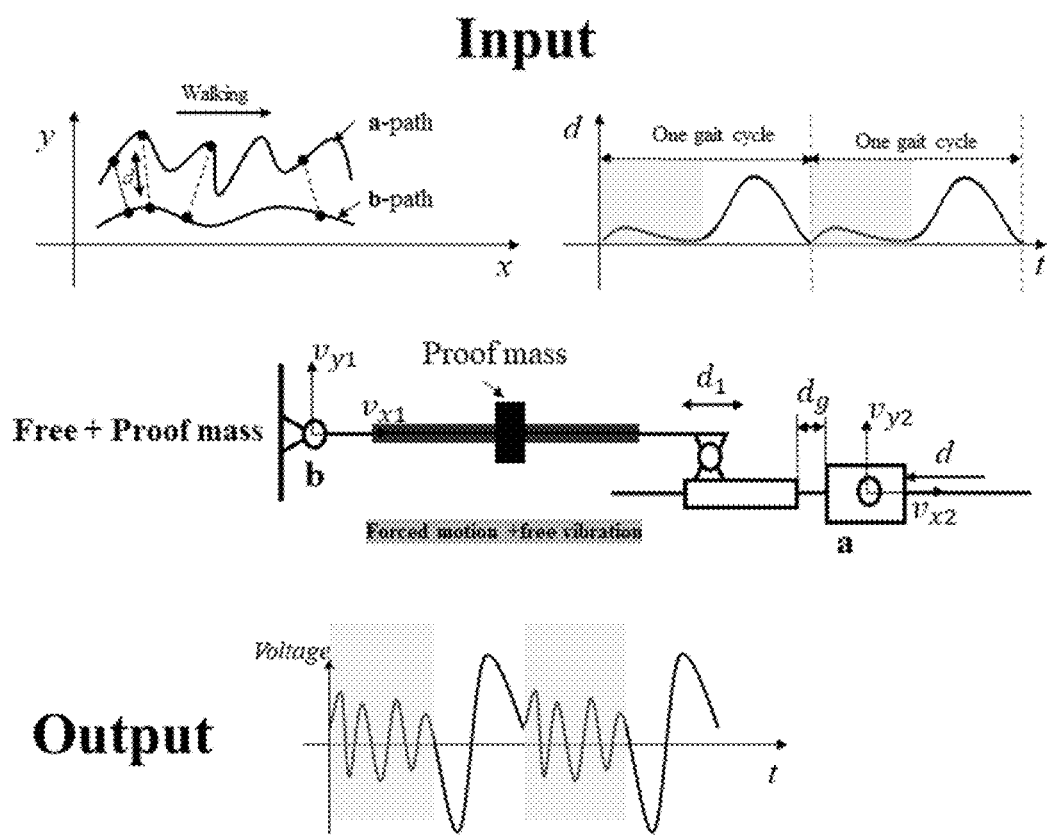

The slider block 206 and the slider 207 may be configured to be operated in two contact modes: a fixed contact mode and a free contact mode. FIG. 7A is a schematic view showing the slider stopper 206 and the slider 207 are configured in the fixed contact mode. As shown in FIG. 7A, in the fixed contact mode, the slider 207 is fixed to the slider stopper 206, and the bending beam 205 is only subjected to forced motion during one gait cycle of walking. FIG. 7B is a schematic view showing the slider stopper 206 and the slider 207 are configured in a free contact mode. As shown in FIG. 7B, in the free contact mode, the slider 207 may move along the linear guide rail 209, and bending beam 205 will subject to forced motion and free vibration during one gait cycle of walking. FIG. 7C is a schematic view showing the slider stopper 206 and the slider 207 are configured in the free contact mode and the proof mass 203 is fixed to the bending beam 205. When the rotation angle of the knee joint is large, the bending beam 205 is pressed to subject to bending deformation. When the rotation angle of the knee is small, the bending beam 205 may subject to free vibration. In case that the slider stopper 206 is in free contact with the slider 207, the proof mass 203 may be used to adjust the free oscillating motion of the bending beam 205, thereby the energy harvesting efficiency of the human joint energy harvesting device 20 is improved.

Figure 8:
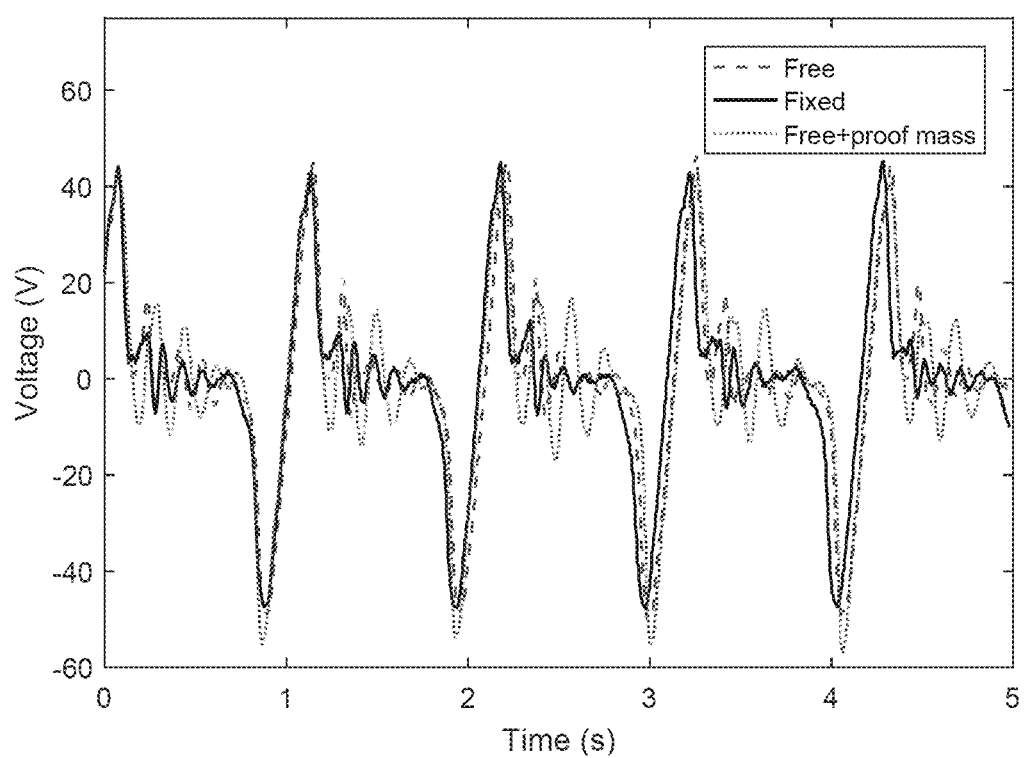
FIG. 8 shows the output voltage of the human joint energy harvesting apparatus under different walking speed according to the first embodiment of the present disclosure.

FIG. 8 shows the output voltage of the human joint energy harvesting apparatus according to the first embodiment of the present disclosure in the three modes shown in FIGS. 7A to 7C. In the test, the user walks on a treadmill at a speed of 4 km/h, and the load resistance of the harvesting apparatus is set as 100 kΩ. It should be noted that, the piezoelectric film is only bonded to the upper surface of the bending beam in the test. As an example, the piezoelectric film has a thickness of 0.3 mm, a width of 28 mm, and a length of 309 mm. According to FIG. 8, it can be seen that when the slider stopper 206 is in free contact with the slider 207, the bending beam 205 will subject to forced motion and free vibration during walking, thereby the deformation of the curved beam is increased to harvest more electrical energy.

Although the knee joint is described in the above embodiment, it should be noted that the knee joint is merely used as an example. In other embodiments, the knee joint may be replaced with an ankle joint, an elbow joint, or the like.

Further, the above energy conversion unit is not limited to a piezoelectric film, but may be configured as a friction transducing unit capable of converting mechanical energy into electrical energy.

Figure 9:
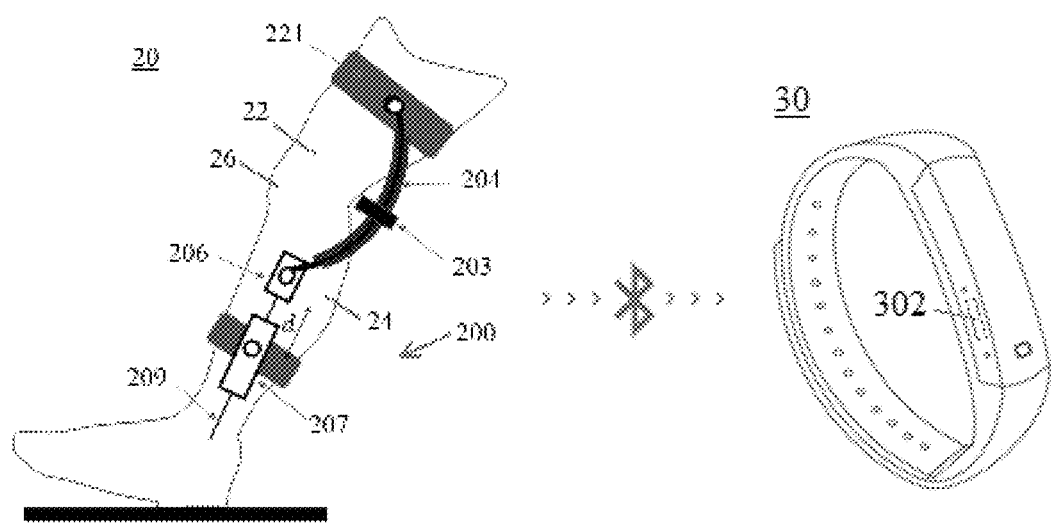
FIG. 9 is a schematic diagram showing a wearable electric device powered by the human joint energy harvesting apparatus according to the embodiment of the present disclosure.

The human joint energy harvesting apparatus in accordance with embodiments of the present application may be used to provide energy for a wearable electronic device. For example, as shown in FIG. 9, the human joint energy harvesting apparatus 20 may be wirelessly connected to an energy supply unit 302 of the wearable electronic device 30 to supply the generated electrical energy to the wearable electronic device 30 through the energy supply unit 302. The wearable electronic device 30 may be, for example (but not limited to) a smart bracelet, a smart watch, a smart ECG monitor, or the like.

Figure 10:
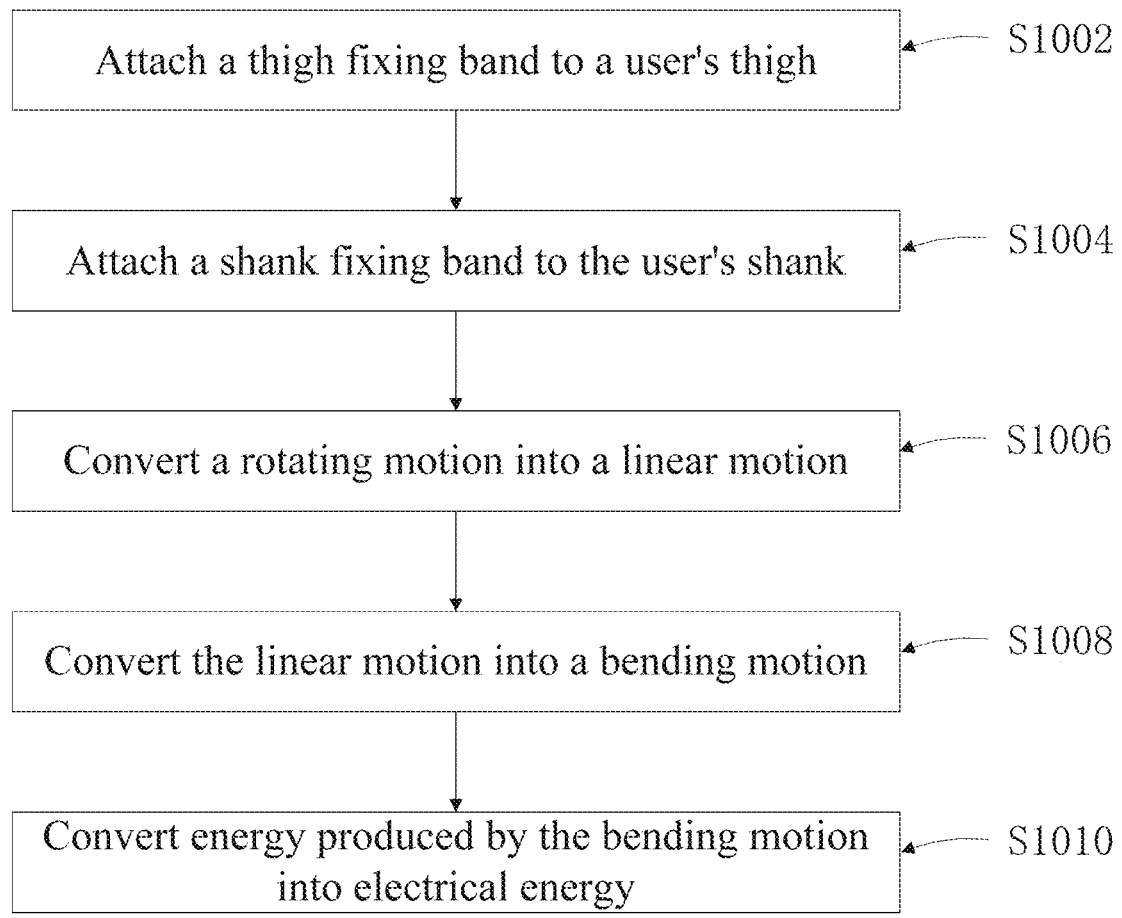
FIG. 10 is flow chart showing a method for harvesting human energy according to the embodiment of the present disclosure.

FIG. 10 is flow chart showing a method for harvesting human energy S1000. In steps S1002 and S1004, a thigh fixing band is attached to the user's thigh and a shank fixing band is attached to the user's shank, respectively. When the knee joint performs the flexion-extension exercise, the motion conversion unit connected between the thigh fixing band and the shank fixing band converts the rotational motion of the knee joint into a linear motion in step S1006. In step 1008, a bending beam is connected to the motion conversion unit, and the linear motion of the motion conversion unit may be converted to a bending motion of the bending beam. In step 1010, an energy conversion unit mounted on the upper surface and/or lower surface of the bending beam is deformed to produce deformation in response to the bending motion, and then the deformation is converted into electrical energy by the energy conversion unit.

In an exemplary embodiment of the present application, for example, a human joint energy harvesting apparatus 20 is worn on a user's leg. When the user walks, the knee joint of the user performs a flexion-extension exercise. The bending beam 205 hinged between the slider stopper 206 and the thigh fixing band 221 is bent. The piezoelectric film 204 bonded to the bending beam 205 is deformed in response to the bending of the bending beam 205. The deformation produced by the piezoelectric film 204 may be converted into electrical energy with the piezoelectric properties of the piezoelectric materials.

For example, the motion conversion unit used in the method S1000 may be the slider-crank mechanism 100' described with reference to FIG. 1B or the slider-linear guide rail mechanism 200 described with reference to FIG. 5. However, it should be understood that these mechanisms are merely used as examples and are not intended to limit the scope of the application.

The exemplary embodiments of the present disclosure have been described above with reference to the accompanying drawings. Those skilled in the art should understand that the above embodiments are merely examples for the purpose of illustration, and are not intended to limit the scope of the disclosure. The scope of the present disclosure should be limited by the appended claims and their equivalents. Any modifications, equivalent replacements, etc. made within the scope of the teachings and claims of the present disclosure are intended to be included within the scope of the present disclosure.

What is claimed is:

1. A human joint energy harvesting apparatus comprising:
   a first fixing band attached to a user's first limb connected with a joint of the user;
   a second fixing band attached to the user's second limb connected with the joint;
   a motion conversion unit connected between the first fixing band and the second fixing band for converting a rotating motion of the joint into a linear motion, wherein the motion conversion unit comprises a slide rail mechanism including a linear guide rail and a slider, the linear guide rail is connected to the first fixing band, and the slider is connected to the second fixing band, the slide rail mechanism works with the first limb and the second limb to operate as a slider-crank mechanism to convert the rotating motion of the joint into a linear sliding of the slider on the linear guide rail, and one end of a bending beam is connected to the slider and the other end of the bending beam is connected to the linear guide rail;
   the bending beam connected to the motion conversion unit, wherein the linear motion of the motion conversion unit is converted into a bending motion of the bending beam; and
   an energy conversion unit mounted on an upper surface or/and a lower surface of the bending beam, wherein the energy conversion unit is deformed to produce deformation in response to the bending motion, and then converts the deformation into electrical energy.

2. The human joint energy harvesting apparatus of claim 1, further comprising:
   a first adaptor fixed on the first fixing band;
   a second adaptor fixed on the second fixing band;
   a first rotating shaft mounted on the first adaptor, wherein the first adaptor is configured to adjust a direction of the first rotating shaft;
   a second rotating shaft mounted on the second adaptor, wherein the second adaptor is configured to adjust a direction of the second rotating shaft,
   wherein one end of the bending beam is connected to the first rotating shaft, and the motion conversion unit comprises:
   a slider stopper with one end connected to the other end of the bending beam;
   a linear guide rail connected to the other end of the slider stopper; and
   a slider mounted on the linear guide rail and rotating around the second rotating shaft.

3. The human joint energy harvesting apparatus of claim 2, further comprising a proof mass fixed to the bending beam.

4. The human joint energy harvesting apparatus of claim 1, wherein the energy conversion unit comprises a piezoelectric film.

5. The human joint energy harvesting apparatus of claim 1, wherein the first fixing band and the second fixing band are parts of the user's garment.

6. The human joint energy harvesting apparatus of claim 1, wherein the energy conversion unit is configured to a triboelectric transducer for converting mechanical energy into electrical energy.

7. The human joint energy harvesting apparatus of claim 1, wherein the joint comprises one of a knee joint, an ankle joint and an elbow joint.

8. The human joint energy harvesting apparatus of claim 1, wherein the energy conversion unit is deformed to produce deformation in response to the bending beam being bent when the joint performs a flexion motion and converts the deformation into electrical energy.

9. The human joint energy harvesting apparatus of claim 3, wherein the slider is fixedly connected to the slider stopper.

10. The human joint energy harvesting apparatus of claim 9, wherein the bending beam is subjected to a forced motion during a whole gait cycle when the user walks.

11. The human joint energy harvesting apparatus of claim 3, wherein the slider freely contacts with the slider stopper and moves along the guide rail.

12. The human joint energy harvesting apparatus of claim 11, wherein the bending beam is subjected to a forced motion and a free vibration during a gait cycle when the user walks.

13. The human joint energy harvesting apparatus of claim 12, when the bending beam is subjected to a forced motion and a free vibration, the proof mass is configured to adjust the free vibration to improve energy harvesting efficiency.

14. A wearable electronic device comprising an energy supply unit, wherein
   when the wearable electronic device is worn by a user, the energy supply unit is electrically connected to the human joint energy harvesting apparatus of claim 1, so as to supply energy produced by the human joint energy harvesting apparatus to the wearable electronic device.

15. A method for harvesting human energy comprising:
   attaching a first fixing band to a user's first limb connected with a joint of the user;
   attaching a second fixing band to the user's second limb connected with the joint;
   converting a rotating motion of the joint into a linear motion by a motion conversion unit connected between the first fixing band and the second fixing band, wherein the motion conversion unit comprises a slide rail mechanism including a linear guide rail and a slider; and the linear guide rail is connected to the first fixing band, and the slider is connected to the second fixing band, and the slide rail mechanism works with the first limb and the second limb to operate as a slider-crank mechanism, wherein the converting the rotating motion into the linear motion comprises: converting the rotating motion of the joint into a linear sliding of the slider on the linear guide rail;
   converting the linear motion of the motion conversion unit into a bending motion of a bending beam with the bending beam connected to the motion conversion unit; and deforming an energy conversion unit mounted on an upper surface and/or a lower surface of the bending beam to produce deformation in response to the bending motion and converting the deformation into electrical energy by the energy conversion unit.

16. The method of claim 15, wherein one end of the bending beam is connected to the slider and the other end of the bending beam is connected to the linear guide rail, and
the converting the deformation into electrical energy comprises:
driving the slider to move along the linear guide rail by a flexion motion of the joint so as to force the bending beam to be deformed; and
converting the deformation of the bending beam into the electrical energy.

17. The method of claim 15, further comprising:
fixing a first adaptor on the first fixing band;
fixing a second adaptor on the second fixing band;
mounting a first rotating shaft on the first adaptor, and adjusting a direction of the first rotating shaft by the first adaptor;
mounting a second rotating shaft on the second adaptor, and adjusting a direction of the second rotating shaft by the second adaptor;
connecting one end of the bending beam to the first rotating shaft, and
forcing the bending beam to be deformed with the linear motion of the motion conversion unit and converting the energy produced by the deformation of the bending motion into electrical energy.

18. The method of claim 16, wherein the motion conversion unit comprises:
a slider stopper with one end connected to the other end of the bending beam;
a linear guide rail connected to the other end of the slider stopper; and
a slider mounted on the linear guide rail and rotating around the second rotating shaft,
wherein converting energy produced by the bending motion into electrical energy comprises:
driving the slider to move along the linear guide rail by a flexion motion of the joint so as to force the bending beam to be deformed; and
converting the deformation of the bending beam into the electrical energy.

* * * * *